United States Patent [19]

Sibley

[11] 4,387,306
[45] Jun. 7, 1983

[54] VITAL CONTACT CHECKING CIRCUIT

[75] Inventor: Henry C. Sibley, Adams Basin, N.Y.

[73] Assignee: General Signal Corporation, Stamford, Conn.

[21] Appl. No.: 276,092

[22] Filed: Jun. 22, 1981

[51] Int. Cl.³ .............................................. H01H 47/00
[52] U.S. Cl. .................................... 307/125; 361/203; 361/204
[58] Field of Search ................ 361/204, 203; 246/249; 340/664; 307/125; 336/170, 173, 182, 183

[56] References Cited

U.S. PATENT DOCUMENTS

| | | | |
|---|---|---|---|
| 3,383,504 | 5/1968 | Dennison | 246/249 |
| 3,428,868 | 2/1969 | Duckitt et al. | 361/204 X |
| 4,225,899 | 9/1980 | Sotiriou | 361/203 X |
| 4,236,149 | 11/1980 | Soyck | 340/644 |

Primary Examiner—Reinhard J. Eisenzopf
Attorney, Agent, or Firm—John F. Ohlandt; Milton E. Kleinman

[57] ABSTRACT

A vital contact checking circuit which senses the state of the back contact of a relay in either a dynamic or static situation. In the former, a signal is coupled from its source to a detector by a coupling device, such as a transformer, and an additional winding on the transformer is connected to the heel and back contact of the relay whose contact is being checked. When a circuit is established through the back contact the additional winding is short circuited, thereby preventing the signal from the source from reaching the detector and effectively eliminating it. A variation of this scheme, also for use in a dynamic situation, involves using the coil structure in a resonant circuit, the sensing winding causing detuning when the back contact is closed so that again, the detector does not receive the signal from the source. For performing a vital check on a static contact, another scheme is utilized because a failure in the oscillator or detector circuit of the schemes already described would give the same indication as a closed back contact. Therefore, the primary and secondary windings of the main transformer are wound on separate cores and the sensing winding links the individual cores so that the detector produces an output only if the sensed contact is indeed closed.

8 Claims, 4 Drawing Figures

VITAL CONTACT CHECKING CIRCUIT

BACKGROUND OF THE INVENTION

1. Field of the Invention

This invention relates to safety systems, and more particularly to those systems which require the closing of a normally open contact to put the system into a more permissive state.

2. Background Information

It is well known in the art, particularly in railroad safety systems and the like, to design the systems to be sensitive to conditions that would threaten the safety of passengers, and to impose requirements on components so as to insure that those components will fail in a manner that will guarantee the safety of the passengers. For example, it is well known in the railroad signalling art to utilize what are termed vital relays, such relays being constructed such that no failure can cause the front contacts to be closed if the coil is not energized.

Thus, safety systems generally require the closing of a normally-open contact to put the system into a more permissive state. If the normally-open contact is on a vital relay, it is directly accepted that if the relay is not energized, the contact is open. However, a difficulty is presented in that vital relays are relatively slow acting and their contacts may not be suitable for applications requiring very large numbers of operations in a given time period, or for interrupting or breaking large currents in circuits. In order to solve such difficulties, specialized relays have been developed such as mercury wetted reed relays; or in some cases, high current contactors may be required. However, this is not a satisfactory answer when safety is a prime consideration because the specialized relays are non-vital relays and they must satisfy the general criterion noted above for vital relays when they are used in safety systems. For example, there must be the ability to prove that a contact is operating as intended and there must be specified insulation resistance and breakdown voltage level to the relay frame, to other contacts etc.

Accordingly, certain multi-contact relays may be acceptable for use in vital circuits provided they satisfy the previously noted insulation and breakdown voltage criteria and if it is certain that all contacts operate together; that is, they are mechanically connected by an insulated pusher. Therefore, if a back contact on a relay of this type is closed, it may be accepted that no front contact is closed.

It will be appreciated however, that on certain other types of relays, for example on reed contact relays there is no mechanical connection between contacts. Thus, even though several reed contact capsules may be exposed to a common magnetic field, there is no assurance that all contacts will respond in the same way.

Accordingly, it is a primary object of the present invention to provide a means to prove that a contact is operating as intended.

Another object is to provide such means without compromising insulation and breakdown voltage rating of the relay.

Yet another object is to provide a checking circuit that will assure that a predetermined contact is operating properly, whether that be in a dynamic or static situation.

SUMMARY OF THE INVENTION

The above objects of the invention are fulfilled by the broad feature of a checking circuit the provision of a signal source coupled to a detector by a coupling means, for example, a transformer; also included is a means for controlling the coupling, in the form of a special sense winding on the transformer connected to the heel and back contact of the contact to be checked. When a circuit is established by way of the back contact, the special sense winding either acts to prevent the detector from receiving the signal or acts to insure that it will receive the signal. In the former case, the signal is eliminated because the situation is a dynamic one in which the arrangement is used to prove that cyclically changing contacts are changing in the correct sense at the expected time. The other version or embodiment is for the purpose of sensing a static contact. In all cases, a fundamental restriction is that the front and back contacts must not be able to short to each other.

Other and further objects, advantages and features of the present invention will be understood by reference to the following specification in conjunction with the annexed drawing, wherein like parts have been given like numbers.

DESCRIPTION OF PREFERRED EMBODIMENTS

Figure 1:
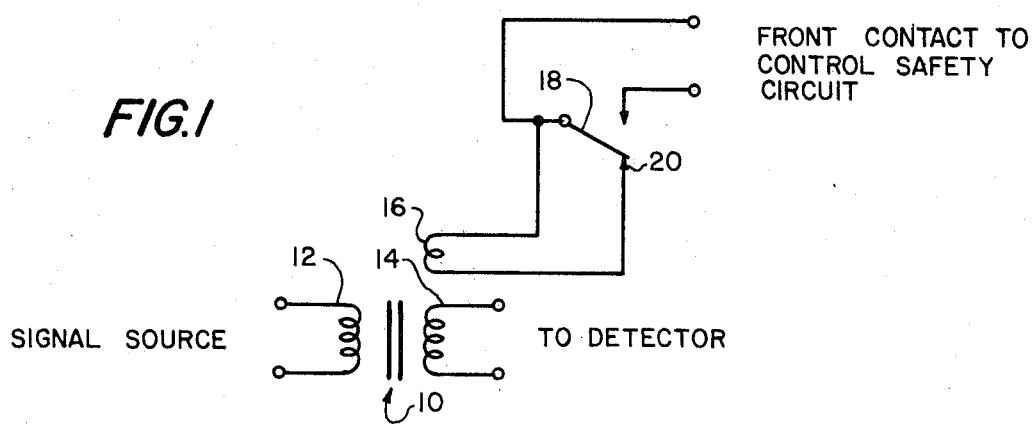
FIG. 1 is a schematic diagram of a first preferred embodiment of a checking circuit for sensing the state of certain relay contacts under dynamic conditions.

Referring now to the figures of the drawing and particularly for a moment to FIG. 1, there will be seen a first embodiment of a checking circuit for sensing the state of the heel to back pair of an individual form C contact. This arrangement is provided so that there is no compromise of the insulation and breakdown voltage rating on the relay.

As shown in the circuit of FIG. 1, an AC signal is coupled from its source to a detector by means of a transformer 10, having a primary winding 12 and a secondary winding 14, in a conventional manner. An additional winding 16 provided on the transformer 10 is connected to the heel and back contacts whose operation is to be checked so as to insure that their operation is correct. It will therefore be apparent that when a circuit is established through the back contact 20 as depicted in FIG. 1 the winding 16 is short circuited and effectively the signal is destroyed in that it cannot reach the detector.

It should be noted that the contact sensing winding 16 requires very few turns of wire. The wire used is provided with insulation that conforms to the isolation requirements of safety circuits. It should also be noted that the front contacts are connected in conventional fashion to the particular control safety circuit such as one that controls the operation of railroad signals or the like.

In implementation of the preferred embodiment of FIG. 1, the signal source might be typically a one mHz sine wave, and the transformer 10 preferably would be wound on a toroidal core. The sensing winding 16 would be one or two turns of No. 16 AWG insulated wire. Transformer 10 must be located close to the back contact 20 to keep the impedance of the short circuited winding low. It will be understood that the use of the aforenoted high frequency allows the utilization of a small structure; and the toroidal core minimizes coupling to sensing circuits that may be used with other contacts.

Figure 2:
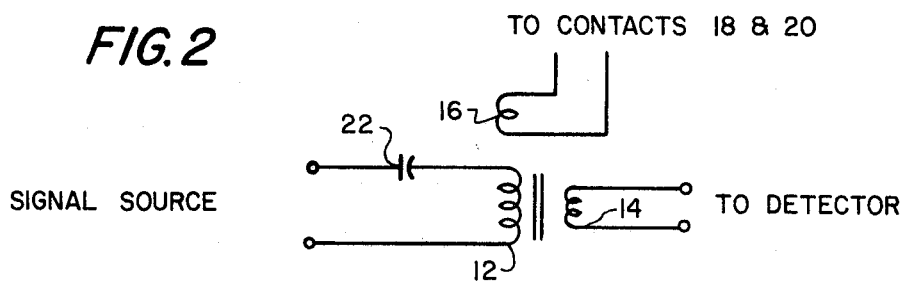
FIG. 2 is another embodiment of a checking circuit for sensing under dynamic conditions.
Figure 2A:
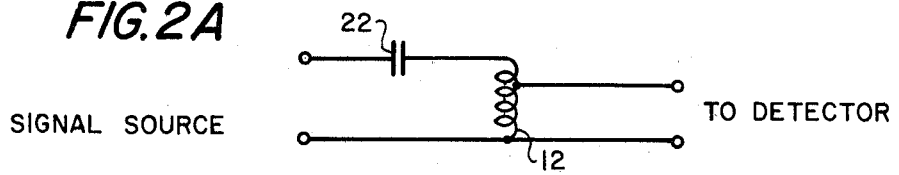
FIG. 2A is a modification of the FIG. 2 embodiment.

Referring now to FIG. 2, another embodiment, similar in principle to the embodiment of FIG. 1, is illustrated in which the winding or coil structure is embodied in a resonant circuit, including capacitor 22; the sense winding 16 is operative to cause detuning when the back contact is closed. The resonant circuit of FIG. 2 can, if desired, be modified such that there is a direct connection to the coil or winding 12 of the circuit, as depicted in FIG. 2A.

In the event that several contacts are to be checked, rather than the single back contact illustrated in FIG. 2, the signal source may be switched to each checking circuit, one at a time, in sequence, and the detector checked for appropriate response. Thus, this kind of switching provides a cycle-check of the detector. If the detector produces an output when the signal is on, it indicates that the front contact may be closed.

The embodiments of FIG. 1 and FIG. 2 are useful for dynamic purposes, that is to say, to prove that cyclically changing contacts are changing in the correct sense at the expected time, as for example in the case of a rate code generator or similar apparatus. However, such circuits do not perform or cannot perform a vital check on a static contact because a failure in the oscillator or detector circuit would give the same indication as a closed back contact. In other words, as can be appreciated from FIG. 1, the signal from the signal source is destroyed or eliminated in the event of a closed back contact and the same effect would be produced with a failure in the signal source or detector.

Figure 3:
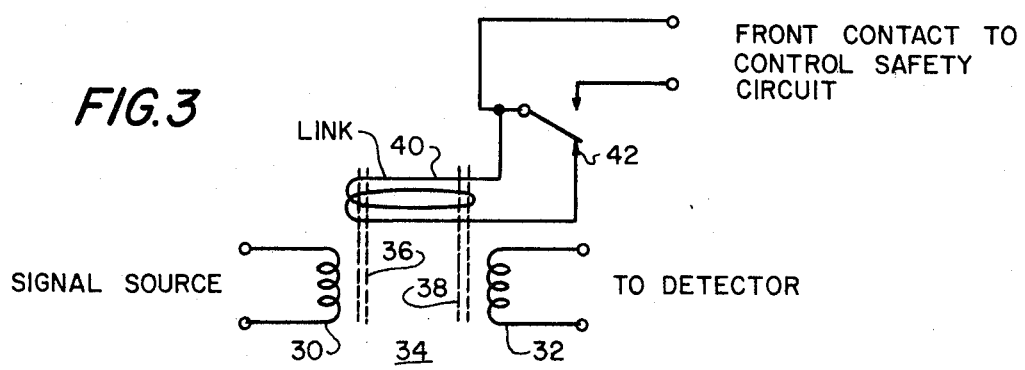
FIG. 3 is a further embodiment of a checking circuit for sensing in the case of a static contact.

However, referring now to FIG. 3, a static contact can be checked by the scheme therein depicted. The primary winding 30 and the secondary winding 32 of the transformer 34 are wound on separate cores 36 and 38. In this scheme or version the sensing winding 40 is used as a linking means; that is, to link the cores 36 and 38. Hence, it will be understood that the detector will produce an output only if the sensed contact 42 is closed.

While there have been shown and described what are considered at present to be the preferred embodiments of the present invention, it will be appreciated by those skilled in the art that modifications of such embodiments may be made. It is therefore desired that the invention not be limited to these embodiments, and it is intended to cover in the appended claims all such modifications as fall within the true spirit and scope of the invention.

I claim:

1. A relay contact checking circuit comprising:
   (a) a relay having
      (1) a pair of front contacts operable to control a safety circuit,
      (2) a pair of back contacts whose state is to be sensed so as to determine the state of said front contacts;
      (3) said front and back contacts including a single common movable contact such that complete isolation is provided between the respective pairs of front and back contacts;
   (b) a signal source;
   (c) a detector;
   (d) means including at least one winding for coupling the signal from said source to said detector; control means for controlling the coupling of the signal from said source to said detector responsive to the state of said back contacts, including a sense winding connected in a closed circuit when said back contacts are closed, thereby to provide an indication of the state or position of the movable contact and hence the state of the front contacts.

2. A circuit as defined in claim 1, in which said means for coupling is a transformer having primary and secondary windings.

3. A circuit as defined in claim 2, in which the primary and secondary windings are wound on separate cores, and said means for controlling the coupling includes the sense winding coupled to both cores so as to link them, whereby the detector receives the signal when said back contacts are closed.

4. A circuit as defined in claim 1, further including a resonant circuit comprising said means for coupling and a capacitor.

5. A circuit as defined in claim 4, in which the sense winding is operative to cause detuning of said resonant circuit.

6. A circuit as defined in claim 4, further including a direct connection of said detector to said at least one winding.

7. A circuit as defined in claim 6, in which the sense winding is short circuited so as to prevent the signal from reaching the detector when the contacts are closed.

8. A circuit as defined in claim 1, in which the signal is not coupled to the detector when said back contacts are closed.

* * * * *